(12) United States Patent
Lebouleux et al.

(10) Patent No.: US 6,198,321 B1
(45) Date of Patent: Mar. 6, 2001

(54) DEVICE FOR THE GENERATION OF A DRIVE SIGNAL PHASE-SHIFTED WITH RESPECT TO AN EXTERNAL SYNCHRONIZATION

(75) Inventors: Nicolas Lebouleux; Benoît Marchand; Corrine Ianigro; Nathalie Dubois, all of Grenoble (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/326,438

(22) Filed: Jun. 4, 1999

(51) Int. Cl.$^7$ .................................................. H03L 7/06
(52) U.S. Cl. .................................... 327/159; 327/150
(58) Field of Search ........................... 327/141, 147–152, 327/156–160; 375/373–376; 331/17

(56) References Cited

U.S. PATENT DOCUMENTS

| | | | |
|---|---|---|---|
| 4,066,978 | * | 1/1978 | Cox, Jr. et al. ............... 331/1 A |
| 4,633,193 | * | 12/1986 | Scordo ........................... 331/1 A |
| 4,694,326 | * | 9/1987 | Demmer ........................ 358/19 |
| 5,477,177 | | 12/1995 | Wong et al. ................... 327/156 |
| 5,477,181 | | 12/1995 | Li et al. ......................... 1327/258 |
| 5,502,711 | * | 3/1996 | Clark et al. ................... 369/124 |

FOREIGN PATENT DOCUMENTS 0 523 953 A1    7/1992   (EP).

* cited by examiner

Primary Examiner—My-Trang Nu Ton
(74) Attorney, Agent, or Firm—Theodore E. Galanthay; Allen, Dyer, Doppelt, Milbrath & Gilchrist, P.A.

(57) ABSTRACT

A device for the generation of a drive signal phase-shifted with respect to an external synchronization signal includes a first digital phase-locked loop to give a reference signal, servo-linked to the external synchronization signal by a current phase among N phases of a high frequency signal. The device includes a second digital phase-locked loop including a measuring circuit to measure the position of an active edge of the drive signal or a derived signal that is delayed with respect to an active edge of the reference signal. The second phase-locked loop also includes a circuit to compute the phase shift to be made and a phase-shift circuit. The measurement circuit includes a circuit for the rough measurement of the position, controlled by a fixed phase of the high frequency signal independent of the present phase of locking in the first loop. The digital computation circuit accounts for this shift between the fixed phase and the present phase. The device applies to circuits for linear signal processing in a monitor.

35 Claims, 9 Drawing Sheets

DEVICE FOR THE GENERATION OF A DRIVE SIGNAL PHASE-SHIFTED WITH RESPECT TO AN EXTERNAL SYNCHRONIZATION

FIELD OF THE INVENTION

The invention relates to a device for the generation of a drive signal that is phase-shifted with respect to an external synchronization signal. Further, the invention relates to systems for the processing of horizontal or linear sweeping signals in a monitor.

BACKGROUND OF THE INVENTION

A horizontal synchronization signal received by a monitor has a frequency usually ranging from 15 to 150 KHz. Generating a drive signal that is resynchronized with the monitor and phase-shifted by a precise value with respect to the external synchronization signal, can be a problem. When the device is balanced, the phase shift comprises a fixed value that does not vary from line to line and a dynamic value which may change from line to line. This dynamic value corresponds especially to variations in balance or fringe effects and depends on the characteristics of the monitor. This phase shift is usually processed by an analog device and thus does not make it possible to externally program these values, with the circuits of the monitor, to modify the phase-shift curves. Usually, it is sought to adjust these phase-shift curves as a function of the monitor requirements.

FIG. 1 shows a conventional phase-locked loop including a phase comparator 1, between the external synchronization signal HSYNC and the reference signal PHI1, which delivers a signed error E at its output. In this example, this error E is applied to a digital filter integrator 2 which, in an output register, provides digital information element C comprising an integer part and a fractional part. A digital filter 2 integrator of this kind is described, for example, in patent application EP A 644 654 entitled "First Order Digital Integrator and Filter" which is incorporated by reference herein and may be referred to for a detailed operation of this circuit.

This signal C is applied to a frequency synthesizer 3 that provides a synthesized signal CKGEN at output. This synthesizer makes it possible to carry out the division, by the integer value INT(C) or by the immediately greater integer value INT(C)+1, of the N phases Fi0 and Fi15 of a high frequency signal F applied to the synthesizer. This is carried out according to a principle described in the European patent application EP 0 641 083 entitled "Frequency Synthesizer" which is also incorporated by reference herein and may be referred to for a detailed operation of this circuit.

The synthesizer comprises a multiplexer MUX for the generation of the synthesized signal CKGEN. This multiplexer receives N phase signals NF0 to NF15, and outputs the synthesized signal CKGEN. The synthesizer selects the phase, among the N phases Fi0 to Fi15 of the high frequency signal F, at which the locking is achieved. This phase selection information PHISELECT controls the multiplexer MUX. In practice, the locking phase may change at each line and therefore the output signal CKGEN has phase leaps. These phase leaps cannot be greater than the difference between two consecutive phases, in the example 325 ps.

This synthesized signal CKGEN is looped to a multiplier 4, which multiplies the signal by M, to provide the resynchronized reference signal PHI1 having the same frequency as HSYNC. In the example, it is desired to have the synthesized signal CKGEN at the frequency of 24 MHZ. Starting with a high frequency signal at 192 MHZ, the digital information C is close to 8 (for 8×24 MHZ=192 MHZ). M is then deduced therefrom to find the frequency of the external synchronization signal HSYNC, such that the frequency of the synthesized signal CKGEN is equal to M times the frequency of HSYNC. The output of the multiplier provides the resynchronized signal PHI1 which, like CKGEN, may have phase leaps. For each line, the corresponding current locking phase is the same as that of the signal CKGEN. It is therefore the one defined by the information PHISELECT.

SUMMARY OF THE INVENTION

Replacing this analog device by a digital device is desired. Phase-locked loop circuits in digital form are already known. Also, it is noted that, in digital mode, the phase shift generally results in a time lag. It is necessary firstly to generate, from an external synchronization signal, a resynchronized reference signal. It is then necessary to compute the phase-shift error between these reference signals and the drive signal in order to be able to correct this drive signal.

The reference signal may be obtained from the prior art digital phase-locked loop represented in FIG. 1. The high frequency signal F used must be very stable and, in practice, is given by an analog phase-locked loop $PLL_0$, for example, as represented in Figure 3. In the example, this loop $PLL_0$ makes it possible to provide the N=16 phases Fi0 to Fi15 of the high frequency signal F at 192 megahertz (MHZ). These 16 phases are shown in FIG. 5. The difference between two consecutive phases is then 325 picoseconds (ps). There is thus obtained a pseudo clock signal at very high frequency HF, at 3.2 gigahertz (GHz).

More particularly, it is desired to make the phase-shift correction by a digital circuit capable of working at very high frequency and therefore capable of performing very fine phase-shift corrections. These very fine phase-shift corrections are performed to obtain a resynchronized and phase-shifted drive signal having a value HPOS with a very fine precision, as compared with the external synchronization signal HSYNC. This value HPOS is determined by programming, and it is controlled by circuits of the monitor.

To obtain this precision in the phase shift, the invention uses the high frequency signal F at 192 MHZ, given by the analog phase-locked loop $PLL_0$ and the reference signal PHI1 given by the first digital phase-locked loop PLL1. However it has been seen that this reference signal PHI1 has phase leaps. If the phase-shift of the drive signal is measured and corrected on the basis of the reference signal PHIL, it is necessary to take account, at each new line, of the current locking phase in the loop $PLL_1$ on which this reference signal PHI1 is resynchronized, to obtain an accurate error measurement. Taking these phase leaps into account results in added time.

Furthermore, it is desired to measure the error to the nearest 325 picoseconds between this reference signal PHIL and the drive signal, in taking account of the programmed value HPOS since it is desired to have a phase shift at equilibrium between this drive signal and the reference signal equal to HPOS. The error signal should be at 325 ps. If a phase comparator is used, it must make it possible to obtain both a resolution and a precision of this kind.

Finally, the measurement of error given by the phase comparator should again be sampled, in order to find out how many cycles of the very high frequency HF signal at 3.25 GHz are contained in the phase shift (number of 325 ps cycles). In sampling this very high frequency, there is necessarily an error amount per edge of the error signal.

One approach to these different technical problems linked to this measurement of error has been found in a device comprising a digital phase-locked loop to servo-control a drive signal with reference to the reference signal PHI1 and comprising a phase-measurement circuit, a circuit for the digital computation of the phase shift to be performed and a phase-shift circuit. According to the invention, the measurement circuit comprises a first circuit for the rough measurement of the phase shift between the drive signal or a delayed derived signal and the reference signal, controlled by a fixed phase PHIREF of the high frequency signal F, independent of the current locking phase in the loop $PLL_1$. The shift between this fixed phase and the current phase is subsequently and digitally accounted for. In this way, the system is no longer hampered by the phase leaps of the signal PHI1.

In one embodiment, the rough measurement circuit comprises elements to reposition the reference signal with respect to a fixed phase of the synthesized signal CKGEN corresponding to the fixed phase PHIREF of the high frequency signal F, and a counter circuit with preloading. This counter circuit is activated by the repositioned reference signal and preloaded at a theoretical value given by the digital computation circuit CCN to count up or count down at the rate of the high frequency fixed phase PHIREF. The counting up is disabled by an inactive edge of the drive signal or of the delayed derived signal. The output of the counter gives the rough measurement expected at output.

Preferably, the measurement circuit further comprises a fine measurement circuit comprising elements to memorize the state of the N phases of high frequency signal F on an active edge of the drive signal and elements to determine the phase at which the edge of the drive signal or of the derived signal, which is delayed, is reached. The corresponding information providing the fine measurement is expected at output. The digital computation circuit outputs, an element of rough and fine phase-shift information pertaining to the programmed value HPOS and the shift existing between the fixed phase and the current synchronization phase. A static value of this information is determined as a function of the rough and fine measurements. This information may have dynamic value as a function of external dynamic phase-shift commands, typically of balance and fringe effects.

The digital phase-locked loop according to the invention also makes it possible to process an information element on an external cyclical ratio in the phase-shift circuit. It is thus possible to make this cyclical ratio vary as necessary.

As characterized, the invention therefore relates to a device for the generation of a drive signal which is phase-shifted with respect to an external synchronization signal. The device comprising a first digital phase-locked loop to give a reference signal servo-linked to the external synchronization signal by a current phase among N phases of a high frequency signal. The device comprises a second digital phase-locked loop comprising a circuit to measure the position of an active edge of the drive signal, or a delayed derived signal, with respect to an active edge of the reference signal, a circuit to compute the phase shift to be made and a phase-shift circuit. The measurement circuit comprises a circuit for the rough measurement of the position, controlled by a fixed phase of the high frequency signal independent of the current locking phase in the first loop. The digital computation circuit comprises elements to account for this shift between the fixed phase and the current phase.

BRIEF DESCRIPTION OF THE DRAWINGS

Other features and advantages of the invention shall appear from the following detailed description, given by way of a non-restricted description of the invention with reference to the appended figures, of which.

DETAILED DESCRIPTION OF THE PREFERRED EMBODIMENTS

Figure 1:
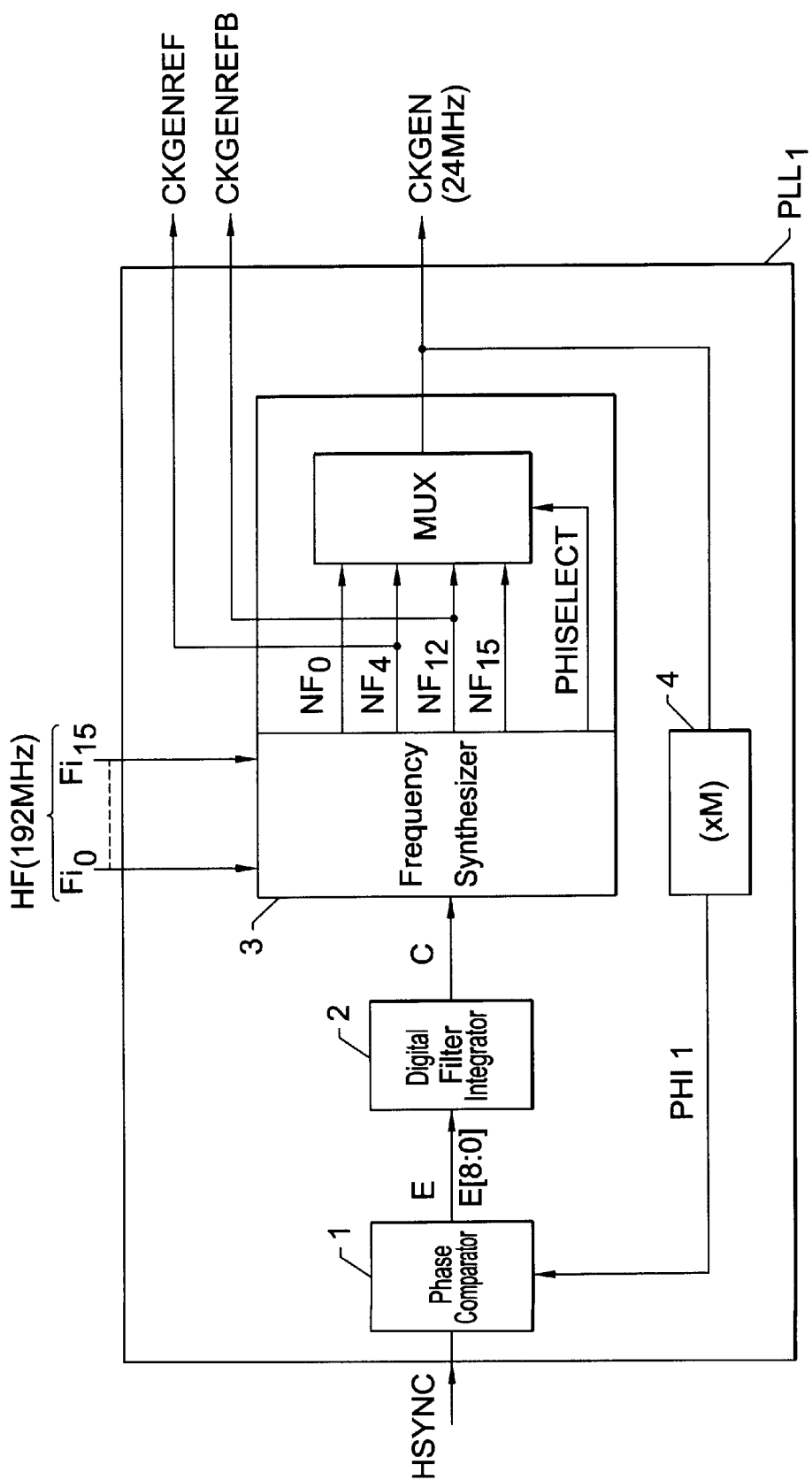
FIG. 1 is a schematic diagram of a prior art digital phase-locked loop $PLL_1$ providing a reference signal PHI1 from an external horizontal synchronization signal HSYNC.
Figure 2:
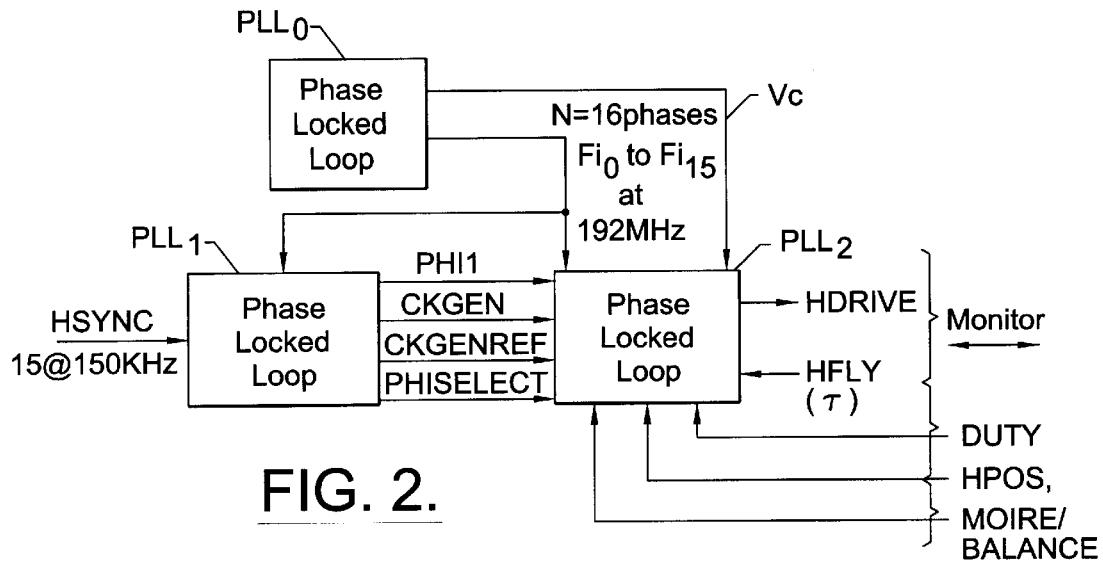
FIG. 2 is a general block diagram of a device according to the invention.

FIG. 2 shows a general block diagram of a device for the generation of a drive signal HDRIVE which is phase-shifted with respect to an external synchronization signal HSYNC according to the invention. The device comprises an analog phase-locked loop referenced $PLL_0$, a first phase-locked loop referenced $PLL_1$ which was described in part above and shown in FIG. 1, and a second phase-locked loop referenced $PLL_2$.

Figure 3:
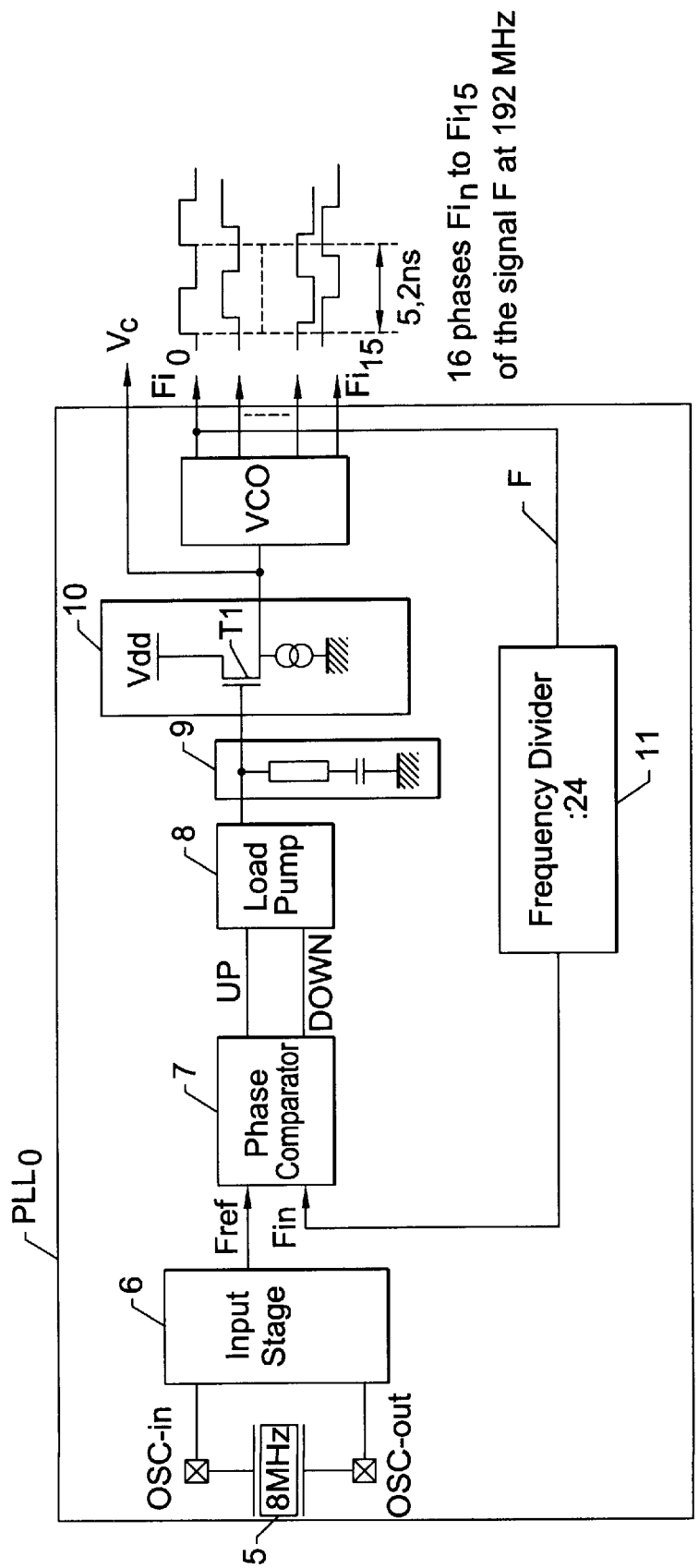
FIG. 3 is a schematic diagram of an analog phase-locked loop $PLL_0$ used in the invention.

An embodiment of the first circuit $PLL_0$ is shown in FIG. 3. It has a quartz crystal oscillator 5 to provide a reference frequency. In the example, the output signal has a frequency of 8 MHZ. This signal is reshaped in an input stage 6 to give a signal $F_{REF}$ with a frequency of 8 MHZ. The circuit $PLL_0$ further comprises, as is standard, a phase comparator 7 followed by a load pump circuit 8, an RC type lowpass filter 9, and a voltage control oscillator VCO whose output is looped to the phase comparator by a frequency divider 11. A circuit 10 comprising a transistor T1 current biased between the positive supply voltage Vdd and ground, and controlled at its gate by the output of the filter 9, provides a control voltage Vc. It is this control voltage Vc that is applied to the circuit VCO.

According to the invention, this control voltage Vc is also applied to the second loop $PLL_2$ and the reasons therefore shall be explained in connection with the operation of this second loop. The circuit VCO provides the N phases Fi0 to Fi15 of a high frequency signal F at output. In the example, this signal F has a frequency of 192 MHZ. As previously described above and shown in FIG. 5, with N=16 phases Fi0 to Fi15 at 192 MHZ, a very high frequency pseudo-clock signal HF at 3.2 GHz is obtained. These 16 phases, which are described further below, make it possible to obtain a very fine resolution of 325 ps. Also in this example, the divider 11 divides by 24.

The N=16 phases Fi0 to Fi15 of the high frequency signal F at 192 MHZ are applied to each of the digital phase-locked loops $PLL_1$ and $PLL_2$ according to the invention. The first loop $PLL_1$ thus receives these N=16 phases Fi0 to Fi15 and an external synchronization signal HSYNC which is the horizontal synchronization signal for a particular application. This loop $PLL_1$ has already been described with reference to FIG. 1. At output, it provides the reference signal $PHI_1$ servo-linked to the external synchronization signal HSYNC under the control of the N phases Fi0–Fi15 of the high frequency signal F (192 MHZ). This loop comprises a frequency synthesizer 3 which provides a synthesized signal CKGEN with an intermediate frequency, for example 24 MHZ, as well as N phase signals NF0 to NF15 of the synthesized signal CKGEN, by frequency division of the N phases Fi0–Fi15 of the high frequency signal F. Finally, this loop $PLL_1$ internally generates a selection information element PHISELECT of the present locking phase at which, at a given instant (in practice for one line), the reference signal PHI1 and synthesized signal CKGEN are synchronized. This present locking phase may change at each line.

Figure 6:
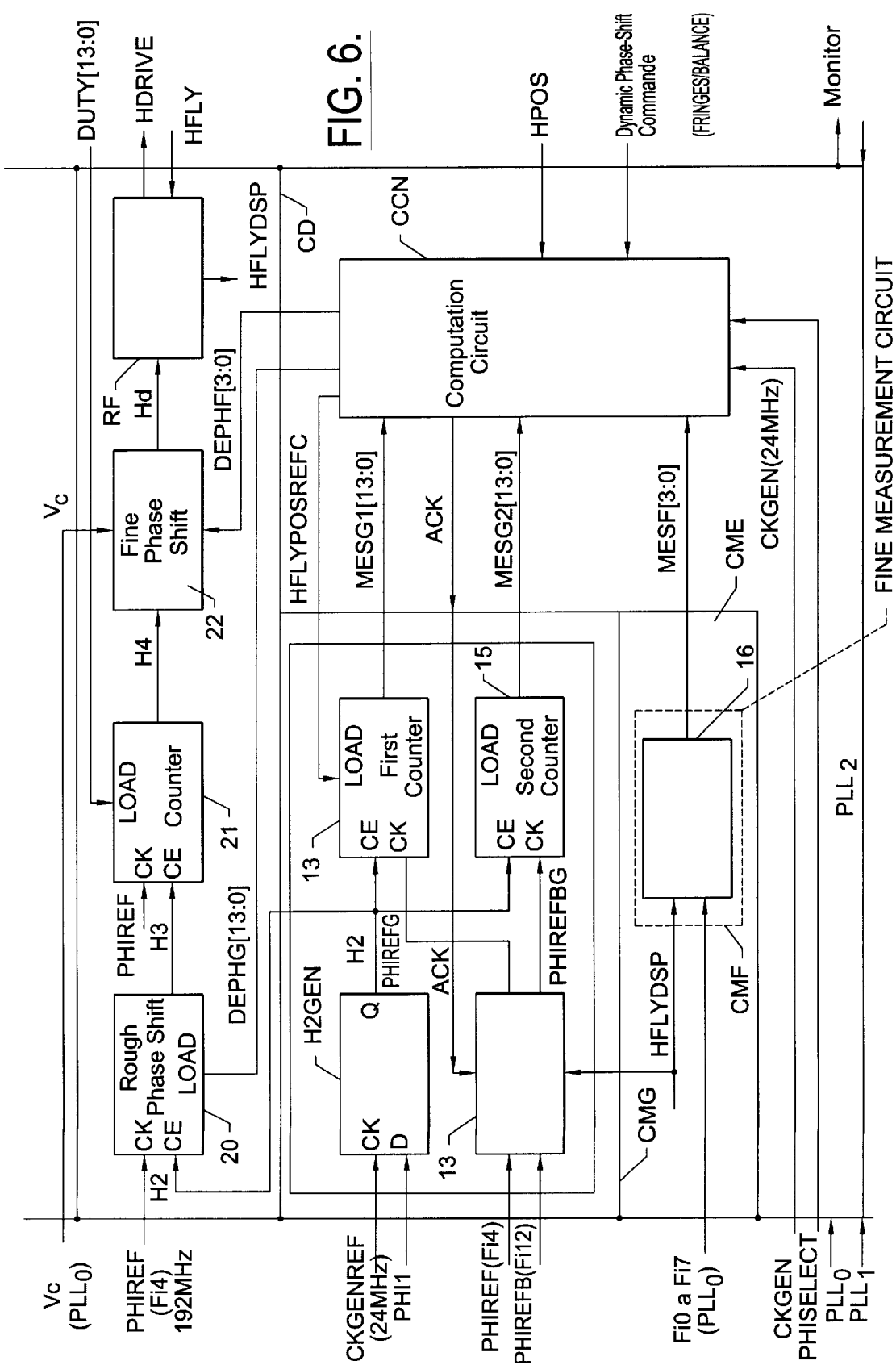
FIG. 6 is a schematic diagram of a digital phase-locked loop $PLL_2$ according to the invention to measure the error and compute and perform the phase shift between the reference signal and the drive signal.

According to the invention, the selection information PHISELECT for the current phase of synchronization, the synthesized signal CKGEN and a fixed phase CKGENREF of this synthesized signal are input to the second loop $PLL_2$. In addition, the reference signal PHI1 is also input to the second loop $PLL_2$. These additional signals will make it possible to measure the phase shift with respect to a fixed phase and, secondly, to account for the phase shift between the fixed phase and the present locking phase in the loop $PLL_1$ for the digital computation of the phase shift to be made. As schematically illustrated in FIG. 6, the second digital phase-locked loop $PLL_2$ according to the invention comprises three circuits each having a different function: an error measurement circuit CME which replaces the commonly used phase comparator; a digital computation circuit CCN for computing the phase shift to be made and a phase-shift circuit CD.

Figure 4:
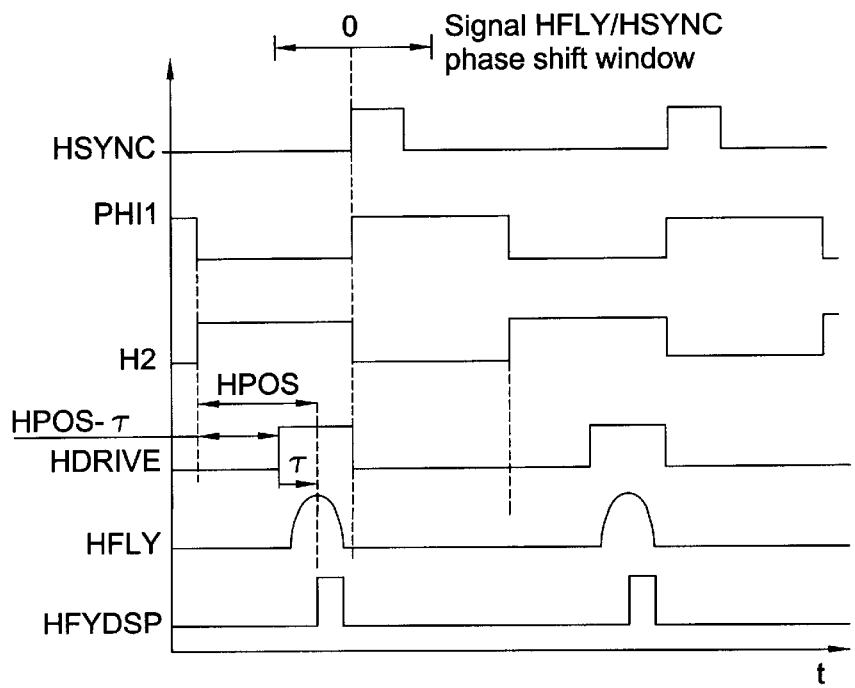
FIG. 4 illustrates the shape of the different signals used or generated in the device according to the invention shown in FIG. 2.

Referring to FIG. 4, an example of the different implemented signals is illustrated. This example shows the external synchronization signal HSYNC applied to the input of the loop $PLL_1$, and the reference signal PHI1, which is synchronous with the signal HSYNC, provided at an output of this loop. In the example, its cyclical ratio is 50%. The signal HDRIVE is the drive signal output by the second loop $PLL_2$. In a particular application of the invention, this drive signal HDRIVE is sent to the monitor which sends it back in the form of a signal HFLY also shown in FIG. 4. The signal HFLY has a delay τ with respect to the drive signal HDRIVE. In this particular application, it is this delayed derived signal HFLY that the loop $PLL_2$ must servo-control; therefore, it is this signal HFLY whose position is measured with reference to the reference signal PHI1 in the measurement circuit CME. However, the principle of the invention can be also applied directly to the signal HDRIVE.

An embodiment of the loop $PLL_2$ in this particular application will now be described. Hereinafter, the active edge is considered to be the leading edge of the signals considered. In the particular application described above, FIG. 4 illustrates that the programmed phase shift HPOS to be obtained is the phase shift between this signal HFLY derived from the drive signal HDRIVE and delayed by τ with respect to the reference signal. In the example shown, this programmed phase shift is such that there is a phase advance of the delayed derived signal HFLY with respect to the reference signal PHI1. To be usable by the measurement circuit CME, the delayed derived signal is reshaped by a circuit RF of the loop $PLL_2$ so that a signal HFLYDSP, showing pulses that are always positive independent of the polarity of the signal HFLY, is obtained. The polarity depends on the monitor. In the example shown, the polarity is positive. For the particular application described, the error is therefore measured with reference to the signal HFLYDSP which is also a signal derived from the drive signal and delayed by τ. As a variation, the error measurement could be done directly with reference to the drive signal HDRIVE.

The measurement circuit CME comprises a rough measurement circuit CMG which, according to the invention, works with reference to a fixed phase PHIREF of the high frequency signal F at 192 MHZ. This fixed phase PHIREF is independent of the locking phase in the loop $PLL_1$. The shift between the fixed phase and the present phase is processed in the digital computation circuit CCN. In the example, the high frequency fixed phase PHIREF is the phase Fi4. In practice, it will be seen that the corresponding fixed phase CKGENREF of the synthesized signal CKGEN is also used. In the example, the fixed phase CKGENREF is therefore equal to the phase NF4. These fixed phases, given by the loops $PLL_0$ and $PLL_1$, and the high frequency complementary phase PHIREFB, equal to Fi12 in the example, are therefore input to the rough measurement circuit CMG.

According to the invention, the rough measurement circuit CMG comprises a repositioning circuit H2GEN to provide a reference signal H2 that is repositioned with respect to a fixed phase CKGENREF among the N phases NF0, . . . , NF15 of the synthesized signal CKGEN corresponding to the fixed phase PHIREF of the high frequency signal F. The rough measurement circuit CMG also comprises a first counter circuit 14, that is preloaded at a theoretical position value HFLYPOSREFC provided by the digital computation circuit CCN. The first counter circuit 14 is activated by the repositioned reference signal H2 to count up or count down at the rate of the high frequency fixed phase CKGENREF. The counting up or counting down is disabled by an active edge of the drive signal HDRIVE or of the derived signal HFLYDSP. The output of the counter provides a first rough measurement MESG1. Therefore, the repositioned reference signal H2 no longer has any phase leaps.

In the example, the repositioning circuit H2GEN comprises a flip-flop circuit receiving the reference signal PHI1 at its D input and the fixed phase CKGENREF of this synthesized signal, with a frequency of 24 MHZ, at its clock input CK. The repositioning circuit H2GEN provides the repositioned signal H2 at the Q output. In the example, and as shown in FIG. 4, this repositioned signal H2 is in phase opposition with the reference signal PHIL. This will make it possible to generate a delayed derived signal HFLY before or after the leading edge of the external synchronization signal HSYNC. In the example shown, the signal HFLY is generated before the leading edge of the signal HSYNC.

Figure 7:
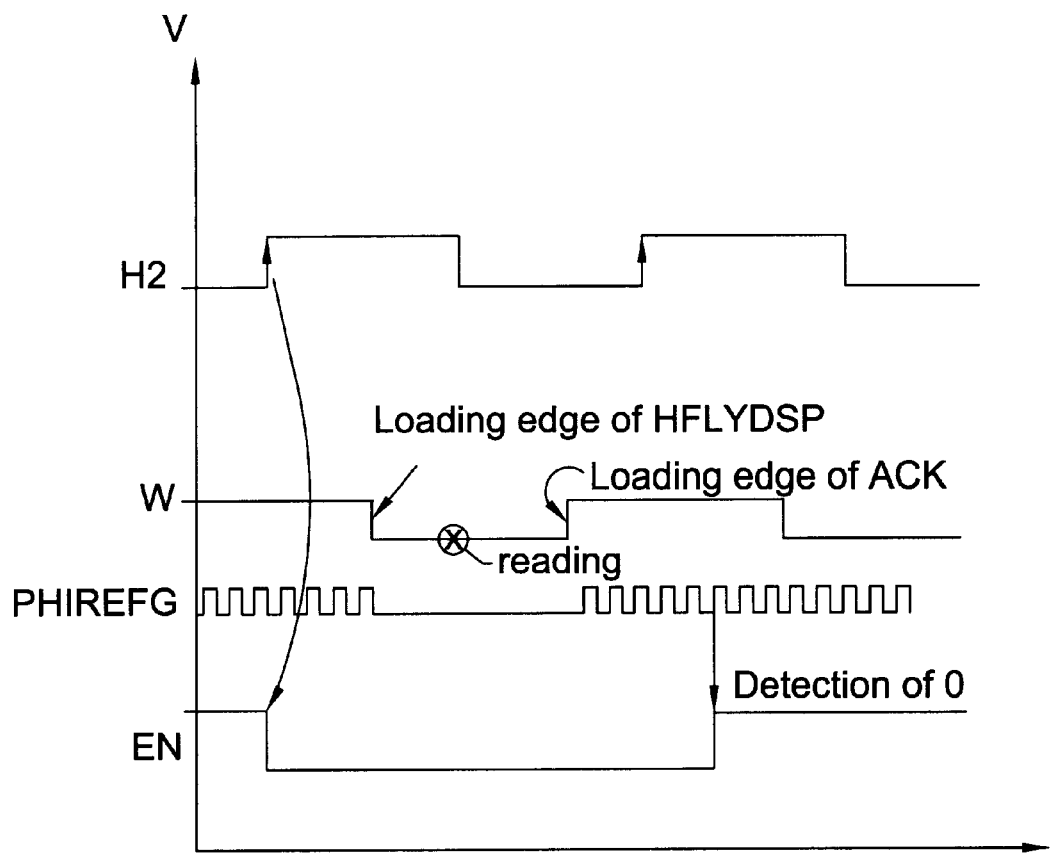
FIG. 7 illustrates the signals pertaining to the operation of the rough measurement circuit of the loop $PLL_2$ of FIG. 6.

To activate the disabling of the countdown, the rough measurement circuit CMG, in the example shown, comprises a window-setting circuit 13 which receives the high frequency fixed phase PHIREF (equal to Fi4 in the example) at input, its high frequency complementary phase PHIREFB (equal to Fi12 in the example), the derived signal HFLYDSP and a state signal ACK coming from the digital computation circuit CCN. At output, this circuit generates a clock signal PHIREFG coming from the high frequency fixed phase PHIREF and a complementary clock signal PHIREFBG, coming from the complementary phase PHIREFB. The signal PHIREFG obtained is shown in FIG. 7. This signal is a copy of the fixed phase PHIREF but is disabled in a window W contained between the leading edge of the signal HFLYDSP and the leading edge of the state signal ACK.

The rough measurement circuit CMG comprises the first counter 14 which, in the example, works in countdown mode. Preferably, the circuit CMG comprises a second counter 15 with preloading which, in the example, works in countdown mode. At their clock inputs CK, the first counter 14 receives the signal PHIREFG and the second counter 15 receives the signal PHIREFBG. Furthermore, the counters 14 and 15 each receive, at their countdown activating input CE, the repositioned signal H2 and, at the preloading input LOAD, a value HFLYPOSREFC provided by the digital computation circuit CCN and corresponding to the theoretical computed position of the leading edge of the signal HFLYDSP. The rough position of the leading edge of HFLYDSP with respect to this theoretical position is obtained at the output of these counters in terms of number of 5.2 ns cycles (corresponding to the clock frequency of 192 MHZ applied to CK).

The operation of the two counters is identical and is explained with reference to FIG. 7 which refers to the counter 14. As previously discussed, the signal applied as a clock signal CK is a copy of the fixed phase PHIREF except in a window W where it is disabled. The start of the window W corresponds to the leading signal of the signal HFLYDSP. Thus, the counting down of the counter 14 is enabled by the leading edge of the repositioned signal H2. The enabling signal EN of the counter is activated. The countdown therefore starts from the preloaded value, HFLYPOSREFC, and is done at the rate of the signal PHIREFG, namely every 5.2 ns. This countdown is stopped on the arrival of the leading edge of the signal HFLYDSP. The computation circuit CCN can then read the output value MESG1 stabilized at the counter 14. This value corresponds to the rough measurement, in terms of numbers of 5.2 ns cycles corresponding to the clock frequency (192 MHZ), of the position of the signal HFLYDSP with reference to the repositioned signal H2.

The counter may then be reset. In the example shown, this resetting is done by resuming the countdown process down to zero. To this end, the digital computation circuit CCN activates the state signal ACK. The end of the window W occurs and the countdown resumes. When zero is reached, a zero detection circuit in the counter deactivates the enabling signal EN. From this time on, and up to the next active edge for the enabling of the signal H2, the counter may account for a new loading value sent by the digital computation circuit CCN.

The counter 15 works in the same way, but has its rate set to the complementary phase. This second counter 15 is used in case the leading edge of the signal HFLYDSP is near the leading edge of the clock signal PHIREFG. At output, it provides a rough measurement signal MESG2. The digital computation circuit CCN reads these two values MESG1 and MESG2 and then determines the value to be taken into account. In the invention, this determining is done on the basis of the result of a fine measurement.

Indeed, to have the desired precision in the invention, it is planned, in addition to the rough measurement based on a fixed phase of the high frequency signal F at 192 MHZ, to perform a fine measurement based on the very high frequency HF (3.2 Ghz). According to the invention, this fine measurement is obtained by storing the state of the phases Fi0 to Fi15 on the active leading edge of the signal HFLYDSP. This makes it possible to determine the phase at which this leading edge arrives with an error of less than 325 ps.

Figure 8:
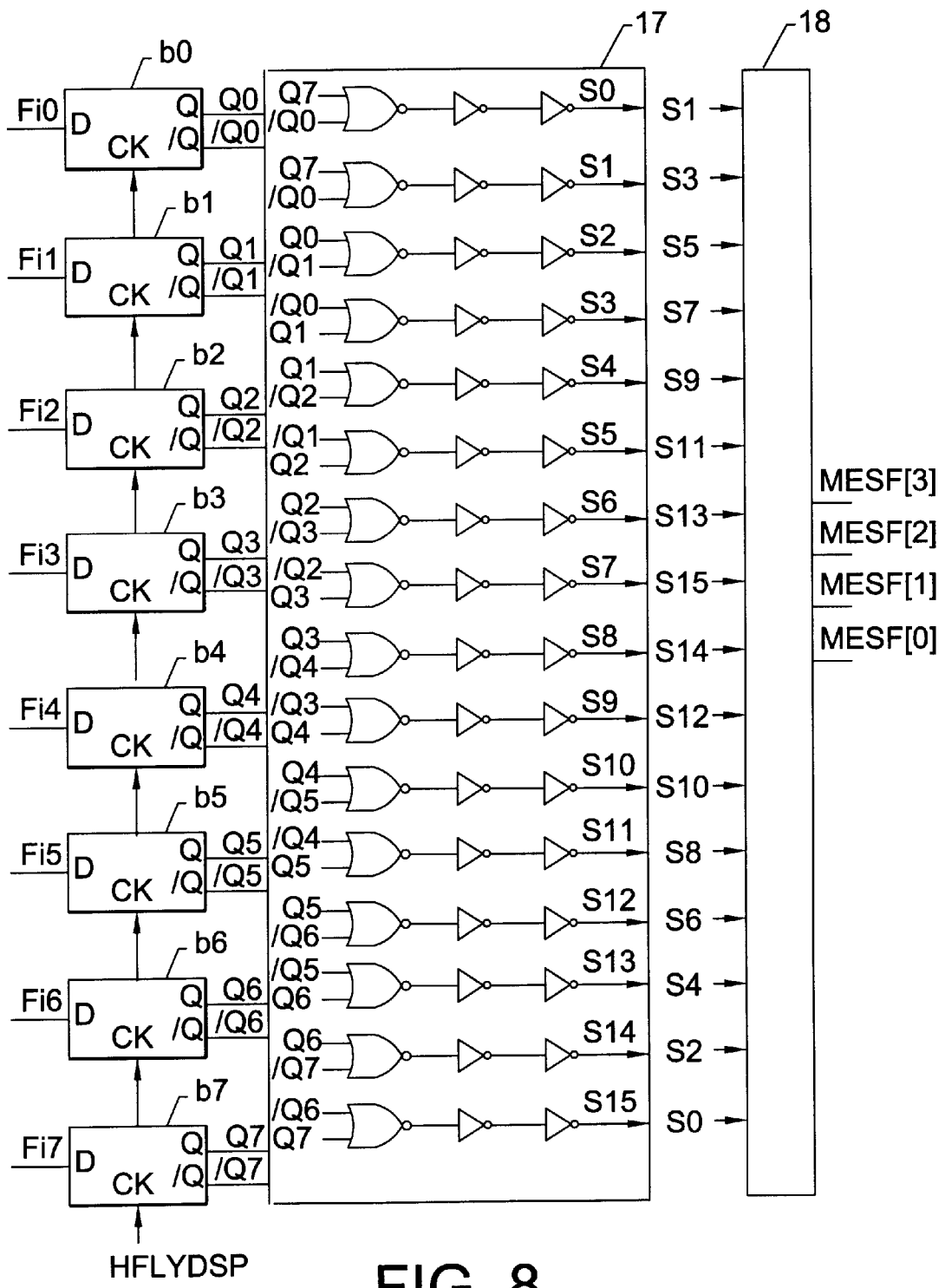
FIG. 8 is a detailed diagram of the fine selection circuit of the error of the loop $PLL_2$ of FIG. 6.

The fine measurement circuit CMF according to the invention is described in detail in FIG. 8. It comprises storage elements to store the state 0 or 1 of the phases of the high frequency signal F on the edge of the signal HFLYDSP. In the example, these storage elements are flip-flop circuits (latches). This example illustrates only half of the phases, the first eight phases Fi0 to Fi7, each applied to the D input of a respective flip-flop circuit b0 to b7. The signal HFLYDSP is applied to the clock input of these flip-flop circuits. By using the direct outputs Q0 to Q7 and /Q0 to /Q7, the state of the 16 phases Fi0 to Fi15 is obtained on the leading edge of this signal.

Figure 5:
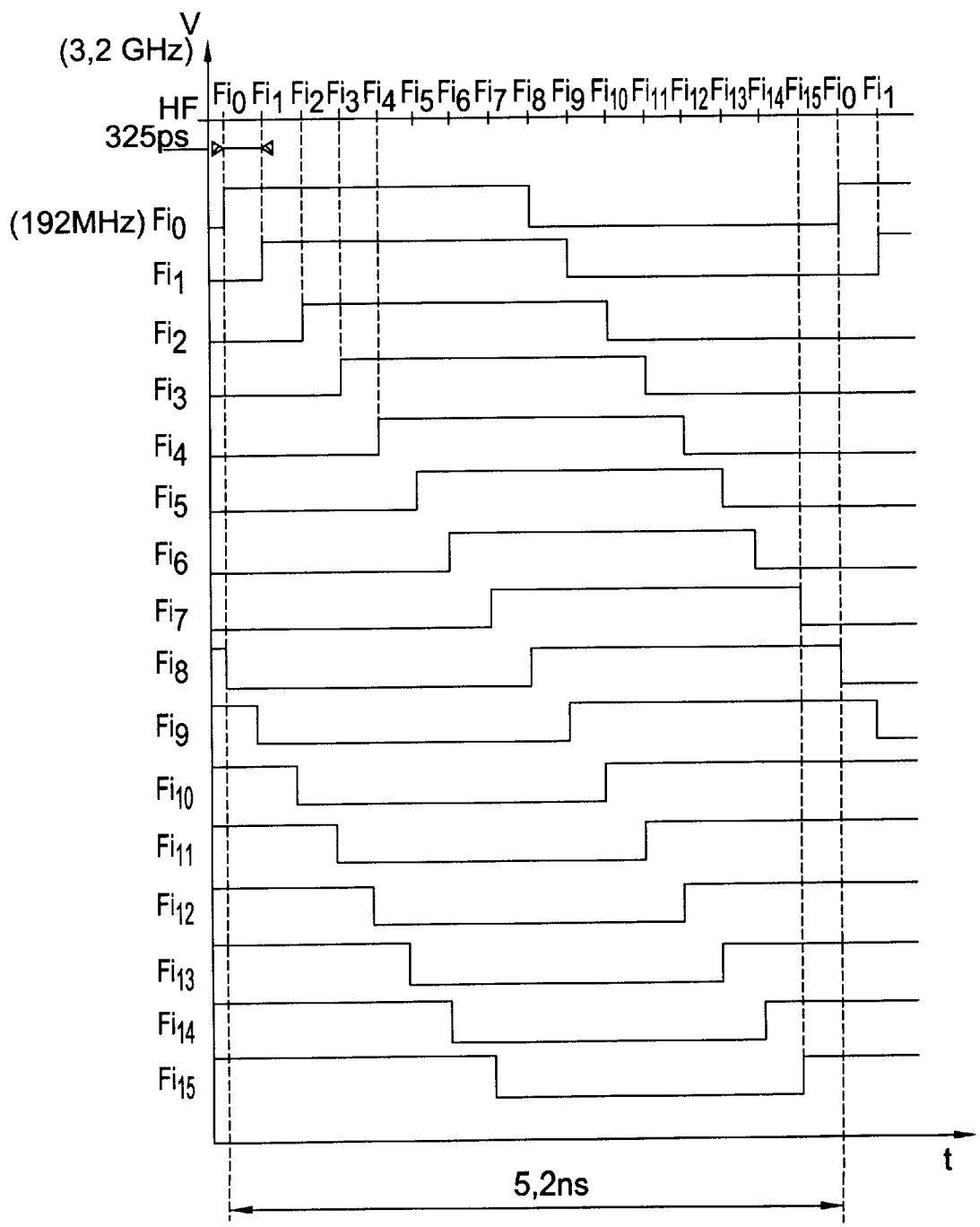
FIG. 5 illustrates the shape of N phases Fi0 to Fi15 of the high frequency signal F and the resultant very high frequency pseudo-clock signal HF.

Referring to FIG. 5 representing the 16 phases, it can be seen that, necessarily, either the outputs Q0 to Qi will all be at 0 and the following outputs Qi+1 to Q7 will all be at 1, or the contrary, with Q0 to Qi at 1 and Qi+1 to Q7 at 0. It is necessary to detect the place at which the transition from 0 to 1 or from 1 to 0 takes place. By having these flip-flop circuits followed by a decoding circuit 17, comprised of logic gates, this identification can be achieved with the direct outputs Q0 to Q7 and complementary outputs /Q0 to /Q7. Sixteen logic signals S0 to S15 are recovered at output. Only one of them is at 1, which corresponds to the phase at which the leading edge of the signal HFLYDSP arrives. An encoding circuit 18 outputs the fine measurement information MESF, on 4 bits in the example.

The digital computation circuit CCN computes the phase-shift correction from the measurements made on the current line to apply it to the next line with the phase-shift circuit CD. The digital computation circuit CCN operates at the rate of the synthesized signal CKGEN (24 MHZ). It comprises means to compute the reference position HFLYPOSREFC, digital comparison means, an accumulator and a dynamic phase-shift management circuit. The error computation is carried out by a digital comparison of the rough measurements MESG1, MESG2 and fine measurement MESF with the reference value HFLYPOSREFC.

The reference value HFLYPOSREFC corresponds in practice to the programmed value HPOS by accounting for the shift between the reference signal PHI1 and the repositioned signal H2, a shift that can vary at each line. This shift is given by the information PHISELECT for the selection of the current synchronization phase in the loop $PLL_1$. The result of the comparison provides the signed error which is added to the contents of the accumulator. When the loop $PLL_2$ is balanced, this accumulator contains the value equal to HPOS−τ. When using the signal HDRIVE directly, applied to the measurement circuit of the loop, this value is simply equal to HPOS.

It is possible to add dynamic phase shifts, typically of balance and fringe effects, to this phase-shift correction. This makes it possible to correct the defects on the monitor due to the drive signal HDRIVE. The circuit which manages these phase shifts is programmable, and receives external dynamic phase-shift commands coming from other circuits of the monitor in the same way as the HPOS information.

In practice, so that the dynamic phase-shift corrections may be accurately processed, the digital computation circuit CCN must accordingly shift the position given by the information HFLYPOSREFC by the value of these dynamic phase-shift corrections to preserve the balance of the loop PLL$_2$. This computation circuit CCN therefore provides the phase shift to be obtained at output. When the loop is balanced, it is the phase shift given by HPOS–τ, plus the dynamic corrections if any. This phase shift comprises a rough value or phase-shift information element DEPHG and a fine value or phase-shift information element DEPHF. The rough value DEPHG indicates the shift to be made in numbers of cycles of 5.2 nanoseconds. In the example, it is encoded on 14 bits. The fine value DEPHF indicates the fine shift to be made in terms of the number of 325 picosecond steps. In the example, it is encoded on 4 bits, making it possible to have a phase shift of 0 to 15 steps of 325 ps (16×325 ps=5.2 ns).

The rough phase shift is conventionally obtained by a counter or rough phase-shift circuit 20 with preloading which, in the example, works in countdown mode. This counter 20 receives the signal H2 at the countdown activation input CE. The rough phase-shift value DEPHG is applied to the preloading input LOAD. The clock signal PHIREF (192 MHZ) is applied to the clock input CK of the counter 20. The operation of this counter is described with reference to FIG. 9. The leading edge of the repositioned signal H2 activates the countdown. This activation makes an internal enabling signal H3 go to zero. The counter 20 reverse counts from the preloaded value DEPHG down to zero. The detection of zero in the counter makes the internal enabling signal H3 go to one, corresponding to a state of preloading the rough phase-shift value DEPHG and of waiting for the next leading edge of the signal H2. The internal enabling signal H3 is the output signal whose leading edge is accurately shifted with respect to the leading edge of the signal H2, by the value DEPHG.

Figure 9:
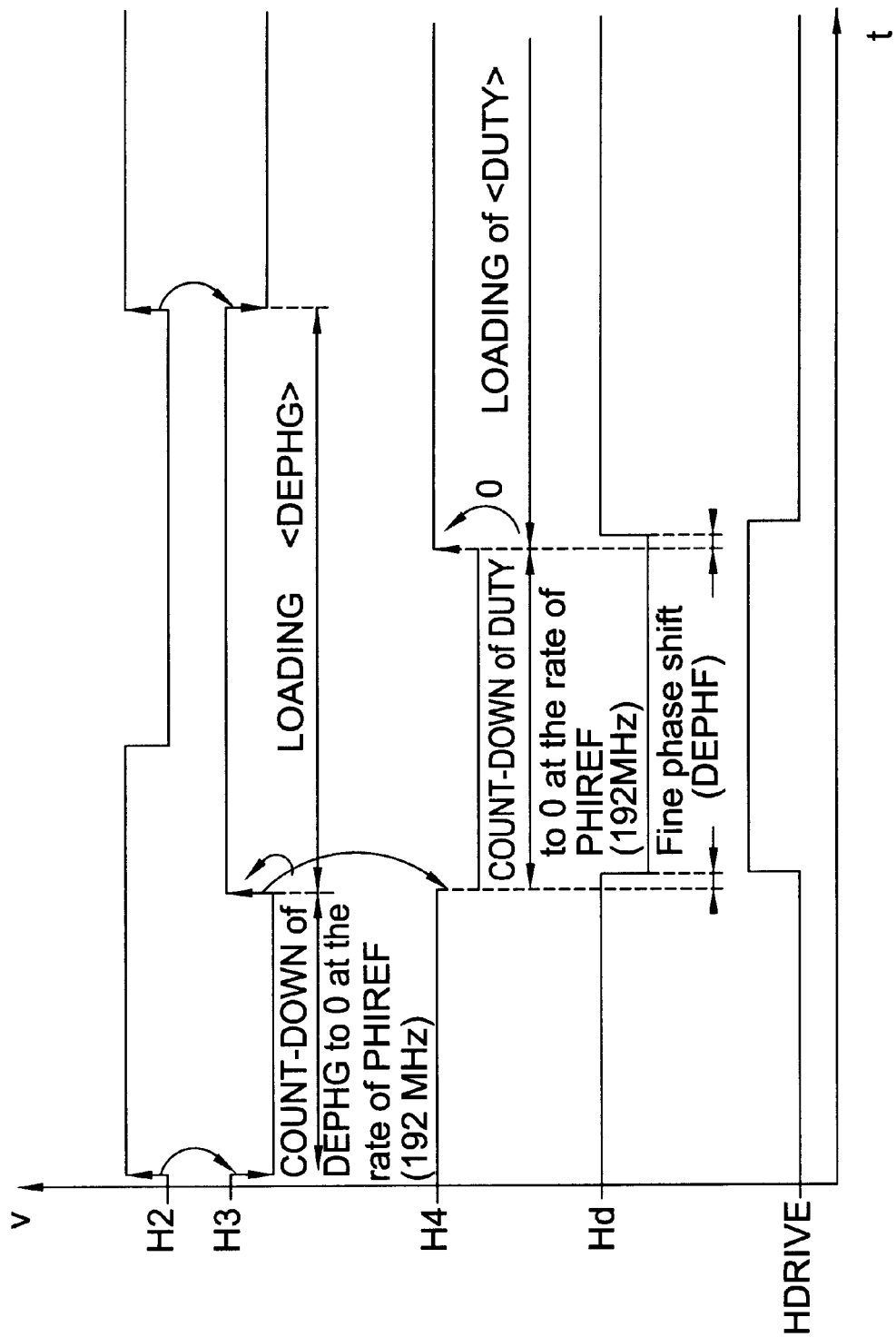
FIG. 9 illustrates the signals corresponding to the rough phase shift and the cyclical ratio provided by the loop $PLL_2$.

This signal H3 will serve as a signal for activating the countdown of a circuit for matching the cyclical ratio. It is another counter with preloading 21 that receives the signal H3 at its countdown activation input CE and the fixed phase PHIREF at its clock input CK and receives a programmed information element DUTY as a preloading value. This information element DUTY makes it possible in practice to set the cyclical ratio between 35 and 65%. The operation of this counter 21 is identical to the previous counter 20. The output signal H4 is the corresponding internal enabling signal and is shown in FIG. 9. This figure again shows the phase for counting down to zero and the phase for loading the value DUTY and for waiting for the next leading edge of the signal H2. This signal H4 is applied to the input of a fine phase-shift circuit 22.

Figure 10:
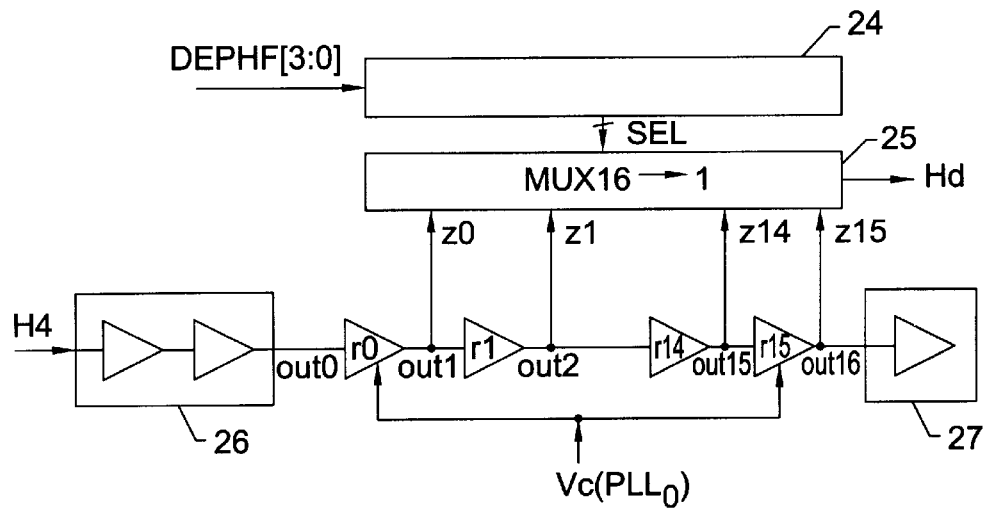
FIG. 10 is a schematic diagram of the operation of the fine phase shift.

The fine phase-shift circuit 22 used in the invention is shown schematically in FIG. 10. According to the invention, this circuit comprises a sequence of delay cells r0 to r15 controlled by the control voltage Vc of the analog loop PLL$_0$. The signal H4 is applied at input to a sequence of delay cells r0 to r15 in series, all identical, each introducing a delay of 325 picoseconds. An input stage 26 and an output stage 27 are provided to make it possible to balance this sequence. They introduce a fixed delay of about 3 ns.

Figure 11:
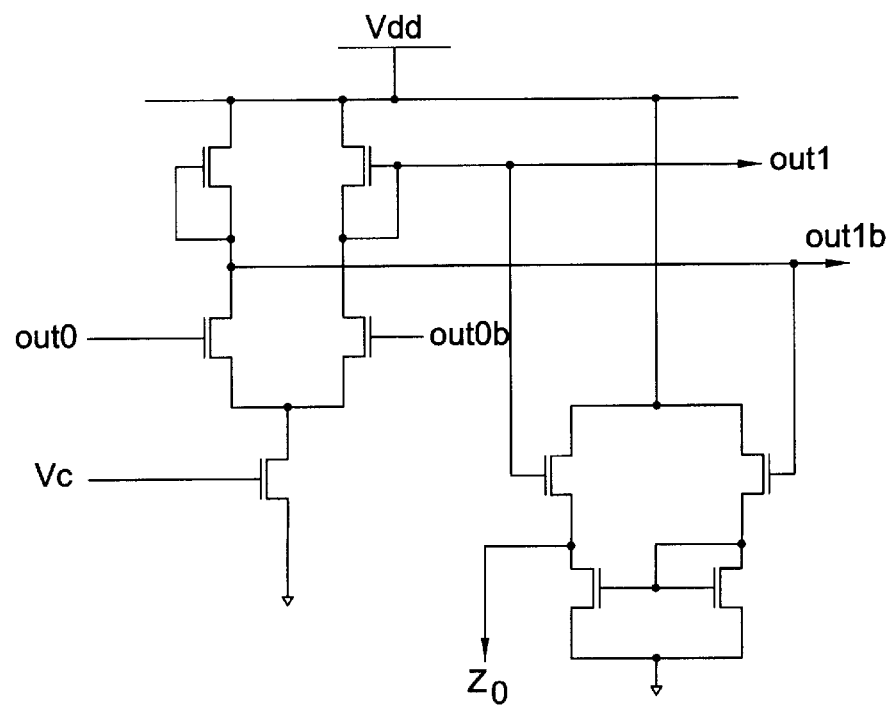
FIG. 11 is a detailed diagram of a delay cell of the fine phase-shift circuit.

The precision is obtained in practice by the use, for each cell, of a voltage controlled inverter, an exemplary embodiment of which is shown in FIG. 11. The control voltage is the voltage Vc given by the phase-locked loop circuit PLL$_0$. The cell provides an output signal z0 offset by 325 ps. The output signals z0 and z15 are applied directly to the input of a 16-to-1 channel multiplexer 25. The multiplexer 25 is controlled by an encoder 24 which provides the channel selection information element SEL on 16 bits as a function of the 4 bits of the fine phase-shift value to be obtained. An accurately phase-shifted signal Hd is obtained at output.

This signal Hd is applied to a circuit RF which provides the signal HDRIVE expected at output and sent to the monitor. This circuit makes it possible to change the polarity of the signal HDRIVE with respect to the signal Hd, as a function of the application. It is this signal that reshapes the signal HFLY sent back by the monitor to give the signal HFLYDSP used internally by the loop PLL$_2$.

The invention that has just been described is not limited to the exemplary embodiments given in detail. In particular, it is possible to use a counting up operation instead of a countdown operation in the measurement circuit or the phase-shift circuit. Nor is the invention limited to the logic conventions used. For example, it is very possible to use trailing edges as activation signals. All these variations remain within the field of the invention. The invention includes the use of the drive signal as well as that of a derived drive signal, shifted internally in the phase-locked loop, and depending on the application concerned.

What is claimed is:

1. A device for the generation of a drive signal phase-shifted with respect to an external synchronization signal, the device comprising:

a first digital phase-locked loop to provide a reference signal which is servo-linked to the external synchronization signal and controlled by a present phase of N phases of a high frequency signal; and a second digital phase-locked loop receiving the reference signal from said first digital phase-locked loop and comprising a measurement circuit to measure a position of an active edge of the drive signal with respect to an active edge of the reference signal, the measurement circuit comprising a rough measurement circuit for rough measurement of the position, controlled by a fixed phase of the high frequency signal independent of the present phase in the first digital phase-locked loop, a computing circuit to compute the phase shift in view of the fixed phase and the present phase, and a phase-shift circuit to shift the phase of the drive signal by the computed phase-shift.

2. A device according to claim 1, wherein the measurement circuit measures a position of an active edge of a delayed signal which is derived from the drive signal.

3. A device according to claim 1, wherein the first digital phase-locked loop comprises a frequency synthesizer to output a synthesized signal and N corresponding phases of the synthesized signal by frequency division of the N phases of the high frequency signal, wherein the rough measurement circuit comprises a repositioning circuit for providing a repositioned reference signal that is repositioned with respect to a fixed phase among the N phases of the synthesized signal corresponding to the fixed phase of the high frequency signal and a first counter preloaded to a value of a theoretical position provided by the computing circuit, wherein the first counter is activated by an active edge of the repositioned reference signal to count up or count down at a rate of the high frequency fixed phase, wherein the first counter is disabled by the active edge of the drive signal, and wherein the output of the first counter provides a first rough measurement.

4. A device according to claim 3, wherein the rough measurement circuit comprises a second counter having a rate of a complementary phase of the high frequency fixed phase, and wherein the second counter provides a second rough measurement.

5. A device according to claim 3, wherein the measurement circuit further comprises a fine measurement circuit for outputting a fine measurement and including storage elements to store a state of the N phases of the high frequency signal at an active edge of the drive signal, and means to determine a phase, among the N phases, at which the active edge arrives.

6. A device according to claim 5, wherein the computing circuit provides a rough phase-shift information element and a fine phase-shift information element to the phase-shift circuit.

7. A device according to claim 6, wherein the rough and fine phase-shift information elements are a function of the rough and fine measurements and external dynamic phase-shift commands.

8. A device according to claim 6, wherein the phase-shift circuit further comprises:
   a rough phase-shift circuit and a fine phase-shift circuit to output the drive signal from the repositioned signal and from the rough and fine phase-shift information elements; and
   a counter for the correction of a cyclical ratio.

9. A device according to claim 8, further comprising an analog phase-locked loop to provide the N phases of the high frequency signal and comprising a voltage-controlled oscillator controlled by a control voltage, wherein the fine phase-shift circuit comprises a sequence of N delay cells controlled by the control voltage.

10. A drive signal generating device comprising:
   a first phase-locked loop, which receives an external synchronization signal and a high frequency signal having N phases, to provide a reference signal which is controlled by a present phase of the N phases of the high frequency signal; and
   a second phase-locked loop receiving the reference signal from said first phase-locked loop and comprising
      an error measurement circuit to provide a measurement of a position of a drive signal,
      a phase shift computing circuit which receives the measurement to compute a phase shift, and
      a phase-shift circuit to provide a phase-shifted drive signal based upon the computed phase shift.

11. A device according to claim 10, wherein the error measurement circuit measures a position of an active edge of a delayed signal which is derived from the drive signal.

12. A device according to claim 10, wherein the error measurement circuit measures a position of an active edge of the drive signal with respect to an active edge of the reference signal, and wherein the error measurement circuit comprises a rough measurement circuit for providing a rough measurement of the position.

13. A device according to claim 12, wherein the error measurement circuit is controlled by a fixed phase of the high frequency signal independent of the present phase in the first phase-locked loop.

14. A device according to claim 12, wherein the first phase-locked loop comprises a frequency synthesizer to output a synthesized signal and N corresponding phases of the synthesized signal by frequency division of the N phases of the high frequency signal.

15. A device according to claim 14, wherein the rough measurement circuit comprises:
   a repositioning circuit to provide a repositioned reference signal that is repositioned with respect to a fixed phase among the N phases of the synthesized signal corresponding to the fixed phase of the high frequency signal; and
   a first counter preloaded to a value of a theoretical position provided by the phase shift computing circuit, wherein the first counter is activated by an active edge of the repositioned reference signal to count up or count down at a rate of the high frequency fixed phase, wherein the first counter is disabled by the active edge of the drive signal, and wherein the output of the first counter provides a first rough measurement.

16. A device according to claim 15, wherein the rough measurement circuit comprises a second counter having a rate of a complementary phase of the high frequency fixed phase, and wherein the second counter provides a second rough measurement.

17. A device according to claim 12, wherein the measurement circuit further comprises a fine measurement circuit to provide a fine measurement of the position of the active edge of the drive signal.

18. A device according to claim 17, wherein the fine measurement circuit comprises:
   storage elements to store a state of the N phases of the high frequency signal at an active edge of the drive signal;
   a decoder to identify a phase, among the N phases, at which the active edge arrives; and
   an encoder to output the fine measurement based on the identified phase.

19. A device according to claim 18, wherein the storage elements comprise flip-flop circuits.

20. A device according to claim 17, wherein the phase shift computing circuit provides a rough phase-shift information element and a fine phase-shift information element to the phase-shift circuit.

21. A device according to claim 20, wherein the rough and fine phase-shift information elements are a function of the rough and fine measurements and external dynamic phase-shift commands.

22. A device according to claim 10, wherein the phase-shift circuit further comprises:
   a rough phase-shift circuit and a fine phase-shift circuit to output the drive signal; and
   a counter for the correction of a cyclical ratio.

23. A device according to claim 22, further comprising an analog phase-locked loop to provide the high frequency signal having the N phases, wherein the analog phase-locked loop further comprises a voltage-controlled oscillator controlled by a control voltage, and wherein the fine phase-shift circuit comprises a sequence of N delay cells controlled by the control voltage.

24. A device according to claim 10, wherein the first and second phase-locked loops comprise digital phase-locked loops, and further comprising an analog phase-locked loop to provide the high frequency signal having the N phases.

25. A combination of a monitor and a circuit for processing linear sweeping signals in the monitor, the circuit comprising:
   a first phase-locked loop, which receives an external synchronization signal and a high frequency signal having N phases, to provide a reference signal which is controlled by a present phase of the N phases of the high frequency signal; and
   a second phase-locked loop receiving the reference signal from said first phase-locked loop and comprising
      an error measurement circuit to provide a measurement of a position of a drive signal,
      a phase shift computing circuit which receives the measurement to compute a phase shift, and
      a phase-shift circuit to provide a phase-shifted drive signal based upon the computed phase shift.

26. A combination of a monitor and a circuit according to claim 25, wherein the error measurement circuit measures a position of an active edge of a delayed signal which is derived from the drive signal.

27. A combination of a monitor and a circuit according to claim 25, wherein the error measurement circuit measures a position of an active edge of the drive signal with respect to an active edge of the reference signal, and the error measurement circuit comprises a rough measurement circuit for providing a rough measurement of the position.

28. A combination of a monitor and a circuit according to claim 27 wherein the first phase-locked loop comprises a frequency synthesizer to output a synthesized signal and N corresponding phases of the synthesized signal by frequency division of the N phases of the high frequency signal, and wherein the rough measurement circuit comprises a repositioning circuit to provide a repositioned reference signal that is repositioned with respect to a fixed phase among the N phases of the synthesized signal corresponding to the fixed phase of the high frequency signal;

a first counter preloaded to a value of a theoretical position provided by the phase shift computing circuit, wherein the first counter is activated by an active edge of the repositioned reference signal to count up or count down at a rate of the high frequency fixed phase, wherein the first counter is disabled by the active edge of the drive signal, and wherein the first counter provides a first rough measurement; and a second counter having a rate of a complementary phase of the high frequency fixed phase, wherein the second counter provides a second rough measurement.

29. A combination of a monitor and a circuit according to claim 25, wherein the measurement circuit further comprises a fine measurement circuit to provide a fine measurement of the position of the active edge of the drive signal, wherein the fine measurement circuit comprises:

storage elements to store a state of the N phases of the high frequency signal at an active edge of the drive signal;

a decoder to identify a phase, among the N phases, at which the active edge arrives; and an encoder to output the fine measurement based on the identified phase.

30. A combination of a monitor and a circuit according to claim 25, wherein the first and second phase-locked loops comprise digital phase-locked loops, and further comprising an analog phase-locked loop to provide the high frequency signal having the N phases.

31. A method of generating a drive signal comprising the steps of:

generating a reference signal servo-linked to an external synchronization signal and controlled by a present phase of N phases of a high frequency signal;

measuring a phase shift between the drive signal and the reference signal;

computing a desired phase shift for the drive signal; and generating a phase-shifted drive signal which is phase-shifted with respect to the external synchronization signal.

32. A method according to claim 31, wherein the step of measuring comprises measuring a position of an active edge. of a delayed signal which is derived from the drive signal.

33. A method according to claim 31 wherein the step of measuring comprises the steps of measuring a position of an active edge of the drive signal with respect to an active edge of the reference signal, and providing a rough measurement of the position.

34. A method according to claim 31, wherein the step of generating the reference signal comprises the step of outputting a synthesized signal and N corresponding phases of the synthesized signal by frequency division of the N phases of the high frequency signal; and wherein the step of providing a rough measurement comprises the steps of generating a repositioned reference signal that is repositioned with respect to a fixed phase among the N phases of the synthesized signal corresponding to the fixed phase of the high frequency signal, counting up or counting down from a value of a theoretical position, at a rate of the high frequency fixed phase, and in response to an active edge of the repositioned reference signal, disabling the counting in response to the active edge of the drive signal, providing a first rough measurement, counting up or counting down at a rate of a complementary phase of the high frequency fixed phase, and providing a second rough measurement.

35. A method according to claim 31, wherein the high frequency signal having the N phases is provided by an analog phase-locked loop.

* * * * *

UNITED STATES PATENT AND TRADEMARK OFFICE
CERTIFICATE OF CORRECTION

PATENT NO.    : 6,198,321 B1
DATED         : March 6, 2001
INVENTOR(S)   : Nicolas Lebouleux, Benoit Marchand, Corinne Ianigro, Nathalie Dubois It is certified that error appears in the above-identified patent and that said Letters Patent is hereby corrected as shown below:

Title page,
Item (54) Title, insert -- signals -- after "synchronization"
Item (75) Inventors, delete, "Corrine" insert -- Corinne --
Item (30) Foreign Application Priority Data, insert
-- June 5, 1998    FR 9807118 --

Column 2,
Line 50, delete, "PHIL" insert -- PHI1 --
Line 57, delete, "PHIL" insert -- PHI1 --

Column 5,
Line 11, delete, "PHIL" insert -- PHI1 --

Column 6,
Line 54, delete, "PHIL" insert -- PHI1 --

Column 14,
Line 16, delete, "active edge.' insert -- active edge --

Signed and Sealed this

Twenty-fifth Day of September, 2001

Attest:

NICHOLAS P. GODICI
Attesting Officer    Acting Director of the United States Patent and Trademark Office